United States Patent [19]

Giles et al.

[11] Patent Number: 4,680,760
[45] Date of Patent: Jul. 14, 1987

[54] ACCELERATED TEST APPARATUS AND SUPPORT LOGIC FOR A CONTENT ADDRESSABLE MEMORY

[75] Inventors: Grady L. Giles; Jesse R. Wilson; Terry V. Hulett, all of Austin, Tex.

[73] Assignee: Motorola, Inc., Schaumburg, Ill.

[21] Appl. No.: 762,656

[22] Filed: Aug. 5, 1985

[51] Int. Cl.$^4$ .............................................. G06F 1/00
[52] U.S. Cl. .......................................... 371/21; 371/11
[58] Field of Search ............................ 371/21, 11, 68; 364/200, 900; 365/200, 201, 230, 49

[56] References Cited

U.S. PATENT DOCUMENTS

| | | | |
|---|---|---|---|
| 3,800,286 | 3/1974 | Brown | 364/200 |
| 4,377,855 | 3/1983 | Lavi | 365/49 |
| 4,532,606 | 7/1985 | Phelps | 365/49 |
| 4,559,618 | 12/1985 | Houseman | 365/49 |

OTHER PUBLICATIONS

J. T. Koo, "Integrated Circuit Content-Addressable Memories", *IEEE Journal of Solid-State Circuits*, vol. SC-5, No. 8, Oct., 1970, pp. 208-215.
T. Ogura, et al., "A 4-Kbit Associative Memory LSI", *IEEE Journal of Solid-State Circuits*, vol. SC-20, No. 6, Dec., 1985, pp. 1277-1282.

*Primary Examiner*—Michael R. Fleming
*Attorney, Agent, or Firm*—John A. Fisher; Jeffrey Van Myers; David L. Mossman

[57] ABSTRACT

Accelerated test circuitry and support logic to test a content addressable memory (CAM). In a CAM array of n entries of m bits per entry, the testing of each word lind, each memory element, each exclusive OR (XOR) comparator and each match line may be thoroughly and quickly tested by means of the parallelism inherent in a CAM array and by the addition of a bulk load mechanism to enable all of the word lines simultaneously. The further addition of an ALLHIT indicator to assess all of the match lines in a single operation also reduces the number of operations and simplifies the test algorithm.

5 Claims, 2 Drawing Figures

ACCELERATED TEST APPARATUS AND SUPPORT LOGIC FOR A CONTENT ADDRESSABLE MEMORY

FIELD OF THE INVENTION

The invention relates to methods and apparatus for testing memory arrays and, more particularly relates to methods and apparatus for testing content addressable memories.

BACKGROUND OF THE INVENTION

Content addressable memories (CAMs) are unique as logic elements because the location of a desired data pattern can be retrieved on command. CAMs also provide a normal read/write access method to allow programming or switching of the data base to be scanned. These features make CAMs ideal for quick data searches, correlation checks, and sorting by value or attribute. A specific application of fast CAMs is in large virtual memory systems.

As the semiconductor industry's average cost per gate continues to drop, CAMs, which were once dismissed as too expensive for all but the highest performance systems, are finding wider application. Today, large CAMs (greater than 1 Kb) are being used for memory management, database management and data flow computing architectures. With their increased usage, testability considerations may exert greater influence on the design of these large CAMs. For a description of integrated circuit CAMs having simple memory cells that are compatible with peripheral circuits designed for existing IC random access memories (RAMs), see J. T. Koo, "Integrated-Circuit Content-Addressable Memories", *IEEE Journal of Solid-State Circuits*, Vol. SC-5, No. 5, October 1970, pp. 208-215.

In general, very little has been published on how to test CAMs. In order to reduce the test time to an absolute minimum, it is desirable to maximize the use of the parallel search capability of CAMs that is built into them.

SUMMARY OF THE INVENTION

Accordingly, it is an object of the present invention to provide hardware and algorithms for testing CAMs.

Another object of the invention is to provide a means and algorithm for testing CAMs that has a minimum number of steps and operations.

Still another object of the present invention is to provide test algorithms and mechanisms for thoroughly testing all aspects of the memory cells without appreciably adding to the overhead of the CAM.

Yet another object of the invention is to provide algorithms and means for testing CAMs that may be applied to any kind of CAM.

It is another object of the present invention to facilitate a high degree of parallelism in the testing of CAM arrays.

In carrying out these and other objects of the invention, there is provided, in one form, a CAM array having n entries of m bits per entry, a word line and a match line for each wherein the match line has a state, x m bit cells each having a word line, a match line a bit line and a complementary bit line. Each bit cell also has a memory element and an exclusive OR comparator of the cell's bit value with a value presented on the bit lines. In addition, there is a HIT/MISS* means for ORing the states of the n match lines. The improvement comprises an ALLHIT means separate from the HIT/MISS* means for monitoring the states of the n match lines. The ALLHIT means also performs an operation with the states from the n match lines and provides an output signal giving the result of the operation. The ALLHIT means may be an AND gate or a scan path. The ALLHIT mean is for determining in one step whether all n match lines tested true.

DETAILED DESCRIPTION OF THE INVENTION

Figure 1:
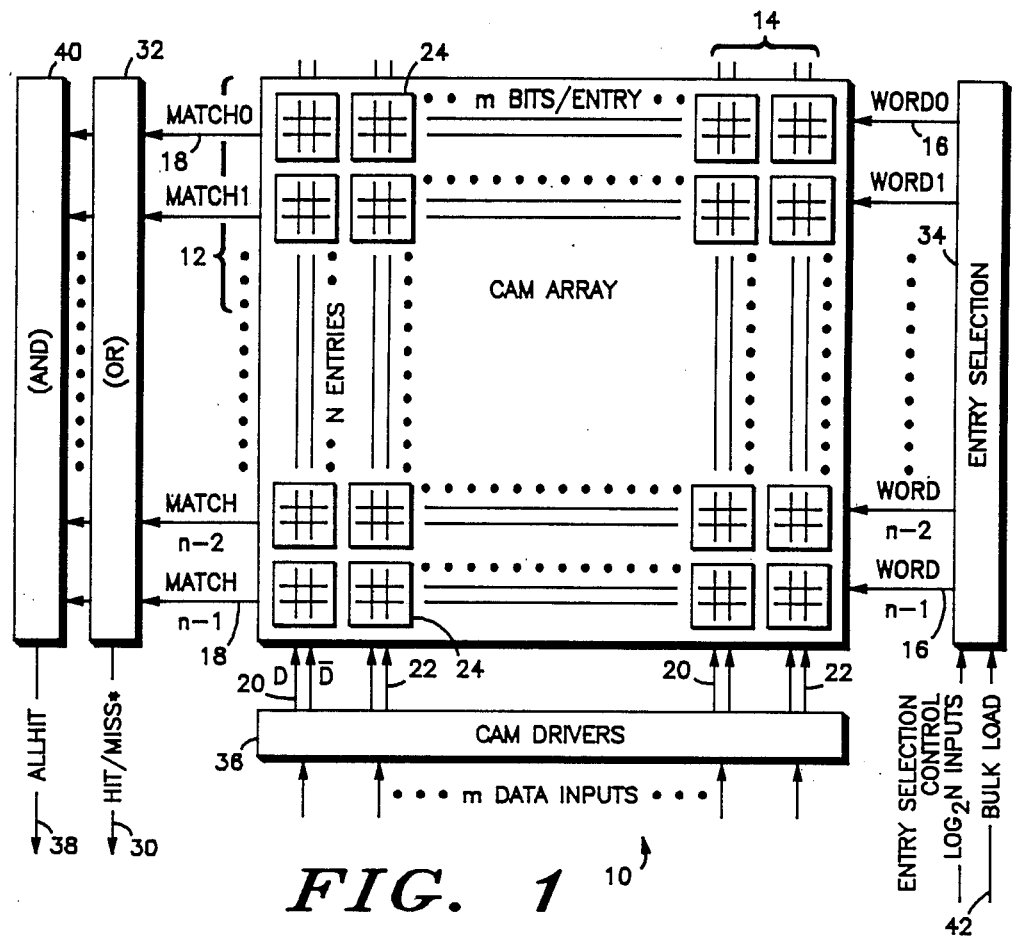
FIG. 1 is a schematic illustration of a CAM array showing its various features including the ALLHIT indicator and bulk load features of the present invention.

Shown in FIG. 1 is a CAM array 10 of n entries 12 (rows) and m bits (arranged in columns 14) per entry 12, for a total of n × m bit cells 24. Each entry 12 has its own word line 16 and its own match line 18, and each of the m columns 14 has two bit or data lines, true line 20 and complement line 22. The word line 16 enables writing every bit cell 24 in the entry 12 with the data presented on the bit lines 20 and 22.

Figure 2:
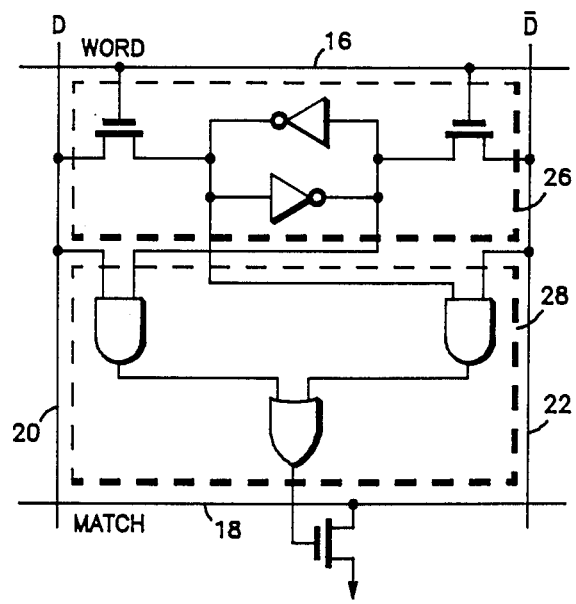
FIG. 2 is a schematic illustration of general, simple form of data or bit cell.

Shown in FIG. 2 is a detailed view of a general and very simple CAM bit cell 24, each of which contains a memory element 26 and an exclusive OR (XOR) comparator 28 of the cell 24's bit value with a value presented on the data lines 20 and 22. Other bit cell 24 designs are well known in the art and the present invention is equally applicable to all known designs.

The entry 12's match line 18 is a distributed NOR of that entry 12's bit cells 24s' XORs. Thus, if all m of the entry 12's XORs compare true, the match line 18 is a 1, otherwise, the match line 18 is a 0. HIT/MISS* line 30 is the output from an OR gate 32 of the n match lines 18, and the CAM 10 is said to "hit" if any entry 12's match line 18 is a 1 upon comparison with a value presented across all the data lines 20 and 22, otherwise the CAM 10 is said to "miss". Thus, HIT/MISS* 30 is the indicator of the success of an attempted associative operation.

Generally, the word lines 16 are indirectly controllable to the extent that any one word line 16 can be asserted via entry selection 34. The match lines 18 are generally indirectly observable in that HIT/MISS* 30 is usually a primary output, or at least there can be a sensitized path from HIT/MISS* 30 to a primary output. The data lines 20 and 22 are directly controllable as primary inputs. In order to test this CAM array 10, it is necessary to test each word line 16, each memory element 26, each XOR 28 and each match line 18.

Because a CAM array 10 is organized as a vertical stack of n entries 12, and the memory elements 26 are static, the basic test of all the memory element 26s' storage capability is a straight forward read-write test. This basic algorithm may be expressed as follows:

1. Proceeding from the top to the bottom of the array 10, write the entry 12's position number into each entry 12.

2. Then, from the bottom up, compare for each of the numbers and observe each entry 12 hit. At this point, the CAM 10 is in a known initial state.

3. Repeat steps 1 and 2 but with the entry numbers complemented.

4. From the bottom up, write the entry number into each entry 12.

5. From the top down, compare for each of the entry numbers and observe each hit.

At this point, all of the memory elements 26 are tested, and all of the XORs 28 are half tested.

Because any XOR 28 must have reconvergent fanout, they require four tests. In a CAM 10, these correspond to hitting on 1s, hitting on 0s (which were done in the segment of the algorithm outlined above), and missing on 1s and missing on 0s. Match line 18 input stuck-at-0 (SA0) faults are equivalent to XOR 28 output SA0 faults, so if all the XORs 28 are tested, the match lines 18 are also tested.

The key to reducing test complexity is to take advantage of the parallel search capability of CAMs 10. The basic algorithm continues by testing the missing on 1s and 0s XOR 28 functions in parallel:

6. Fill the entire CAM 10 array with 0s.

7. Do m compares by "walking a 1 through a field of 0s" (i.e., sequentially placing a 1 in a bit string of 0s until 1 has been in all bits). Each of these m compares should miss.

8. Repeat steps 6 and 7 except fill with 1s and compare walking a 0 through a field of 1s.

This concludes the basic algorithm. The complexity factor of this basic algorithm is $8n+2m$ operations.

The present invention concerns two basic hardware enhancements. The first hardware enhancement would be a feature called "bulk load" 42. It is simply a means to assert all n word lines 16 at the same time, and thus write the same value to all n entries 12 in one operation. For complementary metal oxide semiconductor (CMOS) technology, it is preferred that the bulk load means 42 is a simultaneous precharge of all n word lines 16. For the purpose of illustrating this feature of the invention in FIG. 1, bulk load means 42 is represented by an input line to the entry selection 34. It is evident that the actual enabling of all word lines 16 is performed by entry selection 34. The bulk load operation is made possible by the fact that the CAM drivers 36 are already sufficiently large in order to minimize the comparison time, which is usually the primary CAM 10 design consideration. With this enhancement, algorithm step 6 above, which is done twice, is collapsed from 2n operations to just 2 operations reducing the complexity of the algorithm to $6n+2m+2$ operations.

Consideration of further enhancements and algorithms must take into account the intended CAM 10 application. If there is to be a regular entry decoder, the $\log_2 n$ input decoder 34 will require the 4n operations in steps 1, 2 and 3 of the basic algorithm in any event, irrespective of the CAM array 10's test requirements. Tests of other kinds of circuitry that perform the entry addressing function are beyond the scope of this disclosure. The present invention is directed to CAM applications that lend themselves to partitioned tests, i.e., tests in which the CAM array 10 and the entry addressing circuitry 34 are verified separately. Assuming the inclusion of the bulk load feature 42 and a partitioned test, the second hardware enhancement may be considered.

The remaining test complexity is due to the writing and comparing of unique data in every entry 12 (steps 1 through 5 of the basic algorithm). The only reason this is necessary is due to the fact that observability of the CAM array 10 is funneled through HIT/MISS* 30 which is the output of OR gate 32, forcing the observer to enable only one match line 18 at a time. An ALLHIT indicator is provided which is composed of two parts, line 38, which is an output from functional block 40 having as inputs all n match lines 18. The ALLHIT indicator 38 and 40 can collapse the n term out of the complexity factor. Functional block 40 may be an AND gate, as will be assumed in the following discussion, or may be a scan path, as will be discussed later. Ideally, ALLHIT 38 is made an additional primary output. With the ALLHIT indicator 38 and the bulk load feature 42, the algorithm simplifies to the following:

A. Bulk load array 10 with all 0s.

B. Compare for all 0s and observe ALLHIT 38. The CAM 10 is now in a known initial state.

C. Bulk load all 1s.

D. Compare for all 1s and observe ALLHIT 38.

E. For columns 1 through m, walk a 0 through the field of 1s and observe MISS* 30.

F. Bulk load all 0s.

G. Compare for all 0s and observe ALLHIT 38.

H. Walk a 1 through the field of 0s and observe MISS* 30.

The complexity of this algorithm is $2m+6$ operations. The hardware and algorithm of this invention have been used to test a 2Kb CAM having an array of 32 bits/entry $\times$ 64 entries, on the Motorola 68851 Paged Memory Management Unit (PMMU) with excellent results. To compare the number of operations or complexity of the test flow of the present invention, it may be determined that since $m=32$ and $n=64$ that $2m+8n=576$ operations for the original, "basic" algorithm, as compared with $2m+6=70$ operations for the new algorithm with the enhancements, or approximately a eight-fold improvement. The test circuitry overhead for the ALLHIT indicator 38 and 40 as compared to the CAM array area was only about 1.5%. The additional area for the bulk load feature 42 was negligible.

It is noted that the ALLHIT feature 38 and its AND gate 40, as well as HIT/MISS* 30 and its OR gate 32 each require $n+1$ tests and are not covered in the new algorithm above. It is submitted that this new algorithm will catch all single stuck-at-faults in the array 10. Again, regardless of the design of the entry selection circuitry 34, it is reasonable that the circuitry 34's test would include at least n CAM entry 12 loads. These loads will each cause a hit and can catch all the HIT/MISS* 30 input (match lines 18) SA0 faults.

The case for the ALLHIT feature 38 is not so straightforward, but may be stated as follows. Since ALLHIT 38 and its AND gate 40 are strictly test logic, the question is raised as to if it is important if ALLHIT input (match lines 18) stuck-at-1 (SA1) faults go undetected. In general, one wants to know of all SA1 faults, but if one looks past rigorous application of the single stuck-at-fault criterion, one might ask if there are other faults that may be masked by the untested ALLHIT 38 and 40 input SA1 fault. The purpose of the ALLHIT feature 38 and 40 is to verify that the respective match lines 18 are not SA0. The presence of both the ALLHIT input SA1 fault and the match line 18 SA0 fault implies the existence of a third fault, namely a cut in the match line 18 between the ALLHIT input at AND gate 40 and the rest of the match line 18. Therefore, the worst consequence of not testing the n ALLHIT input SA1 faults in AND gate 40 is that three faults on one CAM entry 12 could occur and not be detected.

Poisson statistics also indicate that the new algorithm is thorough. The larger n is, the more remote the probability of the triple fault occurring on an entry 18, simultaneous with a detectable single fault in any of the other n−1 entries 18 of the array 10 not occurring. In point of fact, the ALLHIT input SA1 faults are testable, but to perform the test is to negate the original reason for inclusion of ALLHIT 38 and 40, the drastic reduction in test complexity.

An alternate form of the ALLHIT strategy is possible. Instead of using an AND gate 40 for the ALLHIT output 38, a scan path (i.e. a shift register) that captures the state of the match lines 18 could be added. ALLHIT 38 would then shift out the test result information in a serial bit stream. This would mean that the single operations in steps B, D and G of the new algorithm would now be n scan clocks (not to be confused with the system clocks). The complexity is 2m+3 operations plus 3n scan clocks, assuming that a scan clock is somewhat less of an operation than either a compare for CAM 10 contents or a CAM 10 load. Scan paths, if they are a loop, are easily testable. Also, some types of entry addressing circuitry 34 might lend themselves to inclusion of an ALLHIT scan path test mode function with little additional overhead. Whatever the absolute overhead, its percentage compared to main circuitry is proportional to n/m to first order.

The general CAM cell 24 shown in FIG. 2 supports a feature called external masking. When both the bit lines 20 and 22 in a column 14 are forced to a logic zero during an associative operation, all of that column 14's XOR comparators 28 will compare true effectively masking all bits 20 and 22 in the column 14. This feature is a CAM bit line drive circuit 36 function independent of the CAM array 10. The test of this external masking function is a twice per column 14 test. If the ALLHIT feature 38 and 40 is included, the test is simply to do a single external mask compare operation on all m columns 14 at the same time after steps D and G of the new algorithm outlined above, and observe ALLHIT 38. However, the new structural elements and algorithm of this invention will work equally well for those CAMs which have other types of memory elements, such as redundant memory elements and those which are capable of internal masking.

It may thus be seen that the new apparatus and methods of the invention facilitate a high degree of parallelism in testing CAM arrays. In addition, the test algorithm is greatly simplified and a minimum of overhead is required for the test circuitry.

We claim:

1. A content addressable memory (CAM) array comprising:
   n entries of m bits per entry;
   a word line and a match line for each entry, wherein the match line has a state;
   a bit line and a complementary bit line for each bit;
   n×m bit cells each having a word line, a match line a bit line and a complementary bit line, each bit cell further comprising a memory element and an exclusive OR comparator of the cell's bit value with a value presented on the bit lines;
   a HIT/MISS* means for ORing of the states of the n match lines, the HIT/MISS* means having an output;
   wherein the improvement comprises an ALLHIT means separate from the HIT/MISS* means for monitoring the states of the n match lines, performing an operation with the states from the n match lines and providing an output signal giving the result of the operation, wherein the ALLHIT means is selected from the group of means consisting of an AND gate and a scan path.

2. The CAM array of claim 1 including a bulk load means for asserting all n word lines simultaneously.

3. A method for testing a CAM array of claim 1, wherein the m bits are designated columns 1 through m, and each word line also has a state, comprising:
   bulk loading the CAM with all 0s, by making the state of all of the word lines 0;
   comparing the states of the match lines for all 0s and observing the output signal from the ALLHIT means;
   bulk loading the CAM with all 1s by making the state of all of the word lines 1;
   comparing the states of the match lines for all 1s and observing the output signal from the ALLHIT means;
   for columns 1 through m, sequentially walking a 0 bit through the field of 1 bits and observing the output of the HIT/MISS* means;
   bulk loading the CAM with all 0s, by making the state of all of the word lines 0;
   comparing the states of the match lines for all 0s and observing the output signal from the ALLHIT means; and
   for columns 1 through m, sequentially walking a 1 bit through a field of 0 bits and observing the output of the HIT/MISS* means.

4. A content addressable memory (CAM) array comprising:
   n entries of m bits per entry;
   a word line and a match line for each entry wherein the word line provides an input state to the entry and the match line provides an output state from the entry;
   a bit line and a complementary bit line for each bit;
   n×m bit cells each having a word line, a match line a bit line and a complementary bit line, each bit cell further comprising a memory element for capturing the state of the bit line or the complementary bit line if the word line is asserted, and an exclusive OR comparator of the cell's bit value with a value presented on the bit or the complementary bit line, where the OR comparator presents a result of a comparison on the match line;
   a HIT/MISS* means for ORing the states of the n match lines, the HIT/MISS* means having an output;
   wherein the improvement comprises:
   a bulk load means for asserting all n word lines simultaneously, and
   an ALLHIT means separate from the HIT/MISS* means for monitoring the states of the n match lines, the ALLHIT means comprising an AND gate to which the n match lines input and from which an ALLHIT output line gives the result of the AND operation.

5. An algorithm for testing a content addressable memory (CAM) array,
   wherein the CAM comprises:
   n entries of m bits per entry, wherein there are m columns designated 1 through m;
   a word line and a match line for each entry wherein the word line provides an input state to the entry and the match line provides an output state from the entry;
   a bit line and a complementary bit line for each bit;

n×m bit cells each having a word line, a match line a bit line and a complementary bit line, each bit cell further comprising a memory element for capturing the state of the bit line or the complementary bit line if the word line is asserted, and an exclusive OR comparator of the cell's bit value with a value presented on the bit or the complementary bit line, where the OR comparator presents a result of a comparison on the match line;

a HIT/MISS* means for ORing the states of the n match lines, the HIT/MISS* means having an output;

a bulk load means for asserting all n word lines simultaneously, and an ALLHIT means separate from the HIT/MISS* means for monitoring the states of the n match lines, the ALLHIT means comprising an AND gate to which the n match lines input and from which an ALLHIT output line gives the result of the AND operation;

and wherein the algorithm comprises:

bulk loading the CAM with all 0s, by making the input state of all the word lines 0;

comparing the states of the match lines for all 0s and observing the output signal from the ALL-HIT means;

bulk loading the CAM with all 1s, by making the input state of all of the word lines 1;

comparing the states of the match lines for all 1s and observing the output signal from the ALL-HIT means;

for columns 1 through m, sequentially walking a 0 bit through the field of 1 bits and observing the output of the HIT/MISS* means;

bulk loading the CAM with all 0s, by making the state of all of the word lines 0;

comparing the states of the match lines for all 0s and observing the output signal from the ALL-HIT means; and for columns 1 through m, sequentially walking a 1 bit through a field of 0 bits and observing the output of the HIT/MISS* means.

* * * * *